(12) United States Patent
Bakos

(10) Patent No.: US 8,616,010 B2
(45) Date of Patent: Dec. 31, 2013

(54) VORTEX TUBE ENCLOSURE COOLER WITH WATER BARRIER

(75) Inventor: Lou Bakos, Cambridge (CA)

(73) Assignee: Nexflow Air Products Corp., Richmond Hill, Ontario (CA)

( * ) Notice: Subject to any disclaimer, the term of this patent is extended or adjusted under 35 U.S.C. 154(b) by 340 days.

(21) Appl. No.: 13/124,832

(22) PCT Filed: Jul. 29, 2009

(86) PCT No.: PCT/CA2009/001059
§ 371 (c)(1),
(2), (4) Date: Apr. 18, 2011

(87) PCT Pub. No.: WO2010/045707
PCT Pub. Date: Apr. 29, 2010

(65) Prior Publication Data
US 2011/0252815 A1 Oct. 20, 2011

Related U.S. Application Data

(60) Provisional application No. 61/107,127, filed on Oct. 21, 2008.

(51) Int. Cl.
*F25B 9/02* (2006.01)
(52) U.S. Cl.
USPC ............................................. 62/5
(58) Field of Classification Search
USPC ............ 62/5, 93, 238.2; 137/807, 808, 809, 137/812, 852, 854; 277/423; 417/151
See application file for complete search history.

(56) References Cited

U.S. PATENT DOCUMENTS 3,654,768 A 4/1972 Inglis et al.
(Continued)

FOREIGN PATENT DOCUMENTS

| CA | 2430514 A1 | 6/2002 |
|----|------------|--------|
| CA | 2437493 A1 | 8/2002 |
| CA | 2619146 A1 | 7/2008 |
| WO | WO0244631 A1 | 6/2002 |

OTHER PUBLICATIONS

International Preliminary Report on Patentability issued in PCT/CA2009/001059, mailed Apr. 26, 2011, 4 pages.

(Continued)

*Primary Examiner* — Allen Flanigan
*Assistant Examiner* — Antonio R Febles
(74) *Attorney, Agent, or Firm* — Faegre Baker Daniels LLP

(57) ABSTRACT

An apparatus for cooling an enclosure provided. The enclosure has at least one opening for receiving cool air and discharging heated air. The apparatus includes a vortex tube with a first end for discharging warm air and a second end for discharging cool air. The apparatus further includes an inlet between the ends of the vortex tube for directing compressed air tangentially into the interior of the vortex tube. A first housing covers the first end of the vortex tube and creates a space through which warm air is channeled to the exterior. The vortex tube is connected by an attachment to the opening of the enclosure so that the vortex tube can discharge cool air into the interior of the enclosure. The apparatus further includes an air outlet conduit at an end of the attachment to facilitate discharge of heated air for the enclosure. Also, the apparatus includes at least one barrier that permits the outflow of warm air from the first housing and heated air from the air outlet conduit while blocking the inflow of moisture and other substances.

11 Claims, 2 Drawing Sheets

(56) References Cited

U.S. PATENT DOCUMENTS 5,010,736 A * 4/1991 York et al. .................. 62/5
2005/0257533 A1 11/2005 Gunawardana et al.
2008/0209914 A1 9/2008 De Wergifosse et al.

OTHER PUBLICATIONS

International Search Report issued in PCT/CA2009/001059, mailed Nov. 12, 2009, 3 pages.

* cited by examiner

VORTEX TUBE ENCLOSURE COOLER WITH WATER BARRIER

CROSS-REFERENCE TO RELATED APPLICATIONS

The present application is a national phase application, filed pursuant to 35 U.S.C. §371, of PCT Application No. PCT/CA2009/001059 filed on 29 Jul. 2009, which claims the Convention Priority benefit of U.S. Patent application No. 61/107,127 filed on Oct. 21, 2008. PCT/CA2009/001059 and U.S. 61/107,127 are incorporated herein by reference in their entirety.

FIELD OF THE INVENTION

The present invention is directed to the field of devices for cooling an enclosed space such as an enclosure for electronic components, using principles of vortex tube technology.

BACKGROUND OF THE INVENTION

The vortex tube, also known as the Ranque-Hilsch vortex tube, is a device that separates a compressed gas into hot and cold streams. It has no moving parts. Pressurized gas (usually air) is injected tangentially into a swirl chamber and accelerates to a high rate of rotation within an extended tube. As the rotating gas travels along the tube, it separates into a relatively warm outer shell and a cool core. The outer shell of the compressed gas can be allowed to escape from the end of the tube through an annular opening. The remainder of the gas can be forced to return in an inner vortex of reduced diameter within the outer vortex. The rotation rate (angular velocity) of the inner gas is the same as that of the outer gas, resulting in a "solid body rotation" of the gas. The solid body rotation is thought to be due to the relatively long time in which each parcel of air remains in the vortex. This allows friction between the inner parcels and outer parcels of gas to have a notable effect. For this effect to occur, the swirl chamber must be suitably dimensioned, for example to be sufficiently long for the solid body rotation and separation to occur.

Vortex tube-operated enclosure coolers, which are known in the art, have been developed to maintain a cool environment within relatively small enclosures such as electrical enclosures and control panels by producing a refrigerated air stream directed into the enclosure. Systems for electronics enclosures can be required to meet various industry standards, including NEMA standards.

NEMA ratings are standards that are useful in defining the types of environments in which an electrical enclosure can be used. The NEMA rating system is defined by the National Electrical Manufacturer Association (NEMA), and frequently signifies a fixed enclosure's ability to withstand certain environmental conditions.

NEMA ratings are mainly applied to fixed enclosures. For example, a NEMA rating would be applied to a fixed electrical box mounted outside, or a fixed enclosure used to house a wireless access point. Most enclosures rated for use in environments where the enclosure is subjected to spraying of water or cleaning have a NEMA type 4 rating. NEMA ratings have more stringent testing requirements to verify protection from external ice, corrosive materials, oil immersion, dust, water, etc.

The NEMA type 12 rating indicates that a given enclosure is rated appropriately for indoor use to provide a degree of protection to personnel against incidental contact with the enclosed equipment, to provide a degree of protection against dirt, circulating dust, lint, fibers, and other airborne particles and against dripping and light splashing of liquids.

The NEMA type 4 rating indicates that the enclosure is rated for either indoor or outdoor use to provide a degree of protection to personnel against incidental contact with the enclosed equipment, to provide a degree of protection against falling dirt, rain, sleet, snow, windblown dust, splashing water, and hose-directed water. The NEMA type 4 rating also indicates that the enclosure will be undamaged by the external formation of ice on the enclosure.

The NEMA type 4X rating indicates that the enclosure is rated for harsh corrosive conditions as well as the conditions specified for NEMA type 4 above.

It has proven to be difficult to provide a vortex tube cooling apparatus suitable for cooling electronics enclosures that meets the more rigorous NEMA standards. As well, prior art cooling systems suffer other disadvantages. One drawback of known systems stems from the difficulty inherent in a system that permits a flow of external air through an enclosure that may contain sensitive components. As well, when a conventional vortex tube is used, it can provide an opening into the enclosure that permits moisture or other unwanted substances to enter. Further, conventional vortex tubes tend to be larger so that openings are oriented away from possible sources of contaminants.

SUMMARY OF THE INVENTION

Because vortex tubes introduce a stream of cooled air into an enclosure, the enclosure must also be equipped with ventilation means to allow warm air to be discharged from the enclosure. This can pose a problem because the contents of such enclosures usually include electronics or other sensitive materials which could be damaged by extraneous elements such as moisture or other substances which could enter via an air intake or discharge opening. There is a need in the art for providing a vortex tube-operated enclosure cooler with a barrier to entry of such elements that still allows air to be vented from the enclosure. The barrier of the present invention provides improved resistance to the elements and may result in the enclosure attaining a NEMA type 4 or lower rating, thereby presenting advantages at a reduced cost.

In one aspect of the invention, there is provided an apparatus for cooling an enclosure, wherein the enclosure includes at least one opening for receiving a stream of cool air and for discharging heated air from the enclosure. The apparatus comprises a vortex tube having a first opening for discharge of warm air. The vortex tube also includes an opposed second end with a second opening for a discharge of cool air. The vortex tube further includes an inlet between said ends for directing a stream of compressed air tangentially into the interior of the vortex tube. The vortex tube, openings and inlet are configured to achieve a Ranque-Hilsch vortex effect. The apparatus further includes a first housing covering the first end of the vortex tube and a space within the first housing communicating with the first opening and the exterior of the first housing to channel the warm air to the exterior. The apparatus also includes an attachment to connect the vortex tube to at least one opening in the enclosure such that the second end of the vortex tube discharges the cool air stream through the attachment into the interior of the enclosure. The apparatus also includes an air outlet conduit at an end of the attachment proximate to the enclosure. The air outlet conduit is configured to communicate with the at least one opening in the enclosure for discharge of heated air from the enclosure. Also, the apparatus includes at least one barrier to permit the outflow of the warm air from the first housing and the heated air from the air outlet conduit while blocking the inflow of moisture and other substances.

In another aspect of the invention, there is provided a method for cooling an enclosure. The method includes the steps of directing compressed air tangentially into the interior of a vortex tube. A further step included in the method is forcing warm air past a barrier to permit the discharge of the warm air from a first opening of the vortex tube. A further step is the discharge of cool air toward the enclosure from an opening defined by an attachment attached to said vortex tube.

Directional references such as "upper", "lower" and the like are used herein merely for convenience of description and do not limit the scope of the invention. All such directional references, whether in the present specification or claims, are defined as being purely relational in nature. It will be understood that the invention may be oriented in essentially any direction.

DETAILED DESCRIPTION

As used herein the term "enclosure" refers to a movable or immovable container or housing that provides shelter for equipment or components that require protection from various elements. A given enclosure may have contents requiring protection against incidental contact or from water or other indoor elements such as dirt, circulating dust, lint, fibers, and other airborne particles and from outdoor elements such as dirt and precipitation. In some embodiments, the enclosure is for protection of electronics and the enclosure cooler is for providing cooling action to the heat generated within the enclosure by the electronics. The term "enclosure cooler" as used herein refers to a device operating to provide cool air from a compressed air source according the principles of vortex tube technology as described in the Background section.

Figure 1:
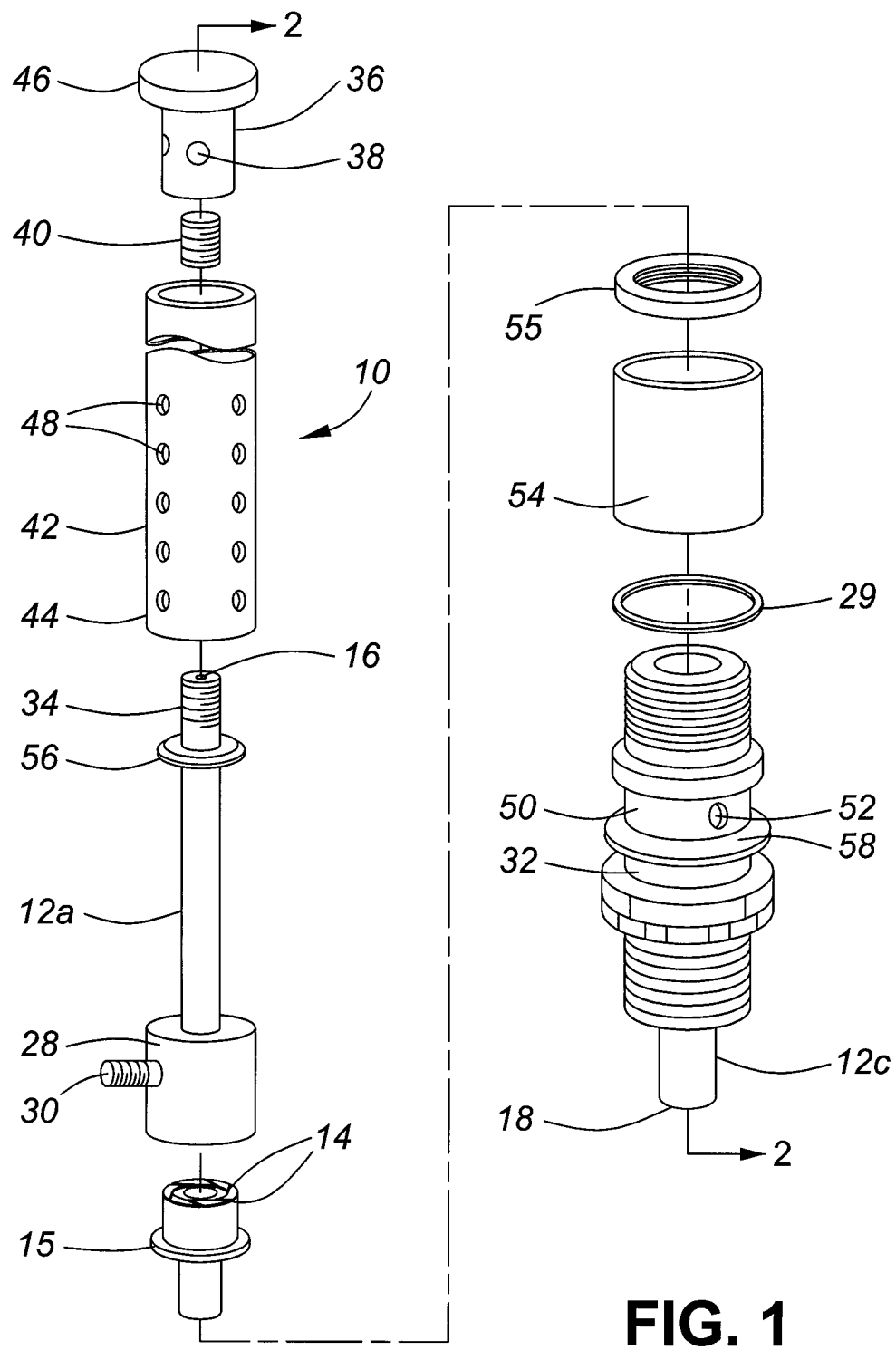
FIG. 1 is an exploded perspective view of the enclosure cooler of an embodiment of the present invention.
Figure 2:
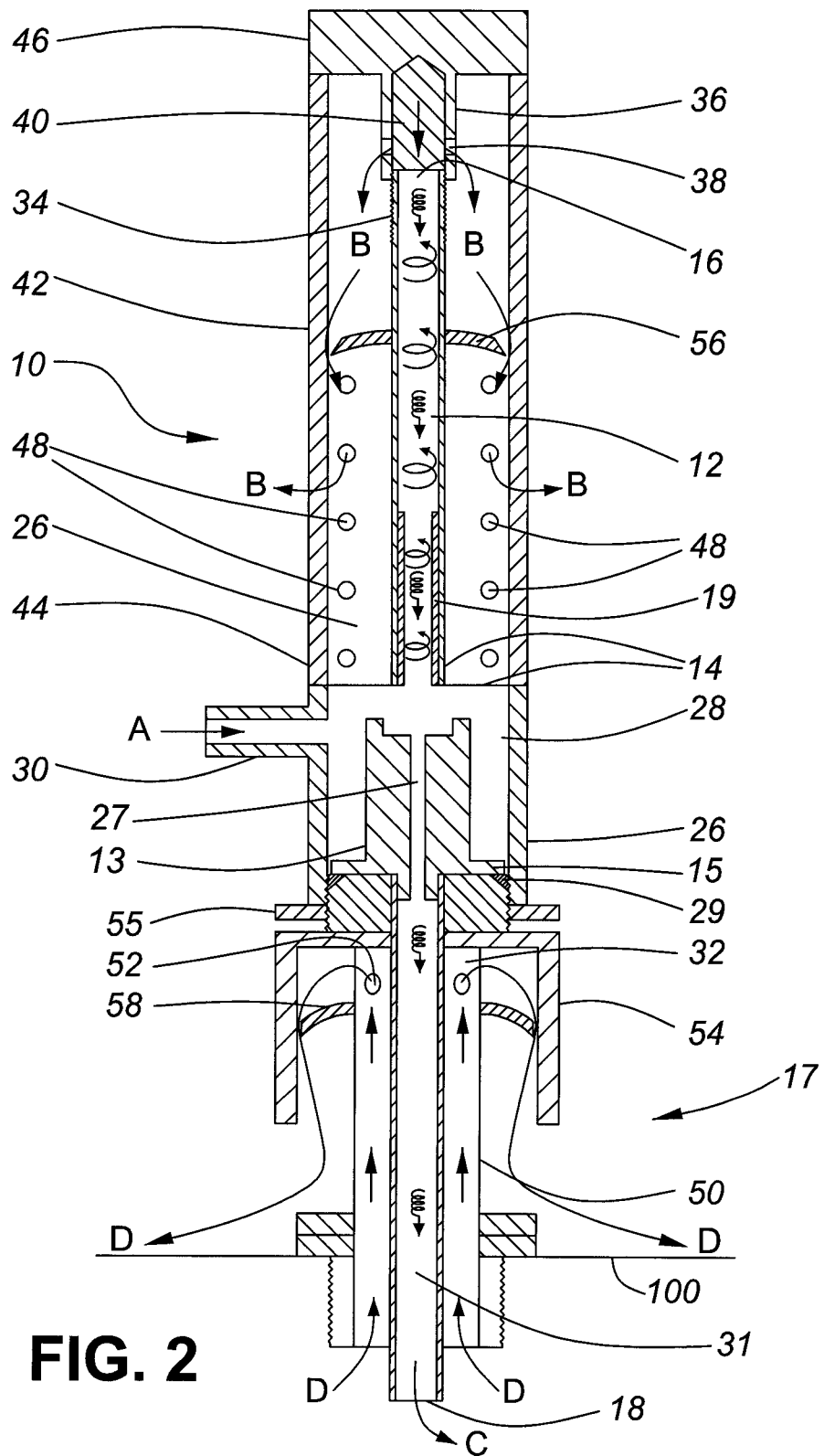
FIG. 2 is a cross-sectional side view of the enclosure cooler embodiment shown in FIG. 1 taken along line 2-2.

According to one embodiment shown in FIGS. 1 and 2, there is provided a vortex tube-operated enclosure cooler 10 which includes a tube 12. The cooler also has a generator 13 with one or more tangential inlets 14 for entry of compressed air and an upper outlet 16 for exit of warm air. The cooler 10 also has an attachment 17 for connecting to an enclosure. The attachment 17 has a lower outlet 18 for the exit of cooled air.

The tangential inlets 14 are ideally equally displaced about the circumference of a top portion of the generator 13.

In certain embodiments such as those described herein, the dimensions of the tube 12 depend on the size of the cooler 10. By way of non-limiting examples, for a small cooler, the inside diameter of the tube 12 may be 0.25 inches and its length may be 3.25 inches. For a medium cooler, the inside diameter of the tube 12 may be 0.437 and its length may be 3.95 inches.

In some embodiments, a sleeve 19 is inserted into the tube 12 and press fit. The sleeve 19 has a smaller internal diameter than the tube 12 and may be formed from brass. Sleeves with varying internal diameters may be used depending on the volume of the compressed air introduced into the cooler 10. Alternatively, an embodiment is contemplated in which no sleeve 19 is incorporated and the internal diameter of the tube 12 is uniform along the length of the tube 12. In a further embodiment, the tube 12 may accommodate a sleeve 19 which is inserted, but which is not press fit. In this embodiment the tube 12 is machined slightly so that the sleeve 19 is removable. Again in this embodiment, sleeves with varying internal diameters may be used depending on the volume of the compressed air introduced into the cooler 10.

The tube 12 is encased in a jacket 26 formed of hard and durable material such as stainless steel. The jacket 26 also includes an annular chamber 28 at its lower end. The generator 13 resides within the chamber 28. The generator 13 is provided with tangential inlets 14 and with a flange 15 around the circumference of the generator 13. The generator 13 has measurements that can vary significantly. By way of non-limiting example, a hole 27 defined by the generator 13 and extending along the length of the generator 13 can have an internal diameter between 0.096 inches and 0.154 inches for a small vortex tube and an internal diameter between 0.189 inches and 0.330 inches for a medium vortex tube. The length of the generator 13 may vary between 1.12 inches and 1.2 inches.

Chamber 28 has an air inlet port 30 protruding radially outwardly which opens into the chamber 28. Port 30 is configured for attachment of a gas line (not shown) for providing compressed air into the chamber 28 at pressures between 0 to 250 psig with optimal pressures between 20 and 120 psig. The compressed air is directed toward the inlets 14. A seal of the flange 15 with the interior sidewall of the swirl chamber 28 is optionally made with an o-ring 29. The flange 15, in combination with the o-ring 29, prevent the input air A from leaking out of the jacket 26 and ensure that input air A is directed upward.

Chamber 28 has a lower opening which may be provided with threads for threaded connection into an enclosure exhaust chamber 32 in the connecting piece 17.

The upper portion 34 of the jacket 26 adjacent the upper outlet 16 of the tube 12 may be provided with threads for connection of a cap 36 in a male-female connection. The cap 36 is provided with one or more cap ventilation holes 38 which allow warm air to escape from the upper outlet 16 of the tube 12. Optionally, the inner side wall of the cap 36 defines a space for a muffler 40 whose function is to reduce the noise of air escaping from the upper outlet 16. The muffler 40 may be formed from flame retardant sound reducing foam or high pressure resistant porous plastic. The muffler 40 may also be formed from sintered bronze or any other sound reducing material.

An upper housing 42 is provided which is optionally removable and is configured to fit over the upper portion of the jacket 26. Housing 42 encases the tube 12. The lower end 44 of the upper housing 42 rests upon the outer edge of the chamber 28. The cap 36 includes an upper disc-shaped plate 46 which fits over, and is flush with, the upper edge of the upper housing 42. The cap 36 thereby fixes the upper housing 42 in place above the chamber 28 providing a streamlined appearance for the cap 36, upper housing 42 and chamber 28.

Upper housing 42 is provided with one or more upper ventilation holes 48. In the embodiments shown in FIGS. 1 and 2, there are four rows of five upper ventilation holes 48 disposed around the circumference of the upper housing 42 and located towards the lower end of the upper housing 42. Warm air escaping from the upper outlet 16 through the cap ventilation holes 38 will then enter the interior of the upper housing 42 and escape from the upper housing ventilation holes 48.

The attachment 17 can be any size that minimizes back pressure. By way of a non-limiting example, for a small vortex tube, the attachment 17 may be 3.2 inches long. For a medium vortex tube, the attachment 17 may be 3.5 inches long. As mentioned previously, the attachment 17 defines a passage 31. The internal diameter of the passageway 31 defined by the attachment 17 used with a small vortex tube is 0.252 inches. The internal diameter of the passageway 31 defined by a attachment 17 used with a medium vortex tube is 0.400 inches.

The enclosure exhaust chamber 32 is formed of a sidewall 50 which contains there within the passageway 31. The sidewall 50 is provided with one or more lower ventilation holes 52. A removable lower housing 54 is configured to cover the outside of the sidewall 50 of the enclosure exhaust chamber 32 forming a space therein. A threaded cylindrical nut 55 locks the housing in place.

The outer sidewall of the exhaust chamber 32 is threaded and configured to be received in a threaded female opening in the enclosure 100.

The enclosure cooler 10 is provided with an upper seal 56 and a lower seal 58 which collectively act as barriers to entry of extraneous elements, particularly entry of water. Seals 56 and 58 may be formed from any impervious material including rubber, plastic and metal. The material from which the seals 56 and 58 are formed is ideally resistant to water and any cleaning chemicals or solutions that may be used on any NEMA type 4X enclosure. The material is also preferably resistant to any corrosion. In a preferred embodiment, the seals 56 and 58 are flexible and resilient and formed of VITON® or an equivalent material. Also, the seals 56 and 58 are preferably annular. The outer diameter of the upper seal 56 is slightly larger than the internal diameter of the upper housing 42. As a result, the upper seal 56 is pressed downward slightly so that the upper seal 56 is slightly domed when engaged with the upper housing 42 so that the inner portion of the upper seal 56 is slightly elevated above the outer portion of the upper seal 56. Similarly, the outer diameter of the lower seal 58 is slightly larger than the internal diameter of the lower housing 54. As a result, the lower seal 58 is pressed downward slightly so that the lower seal 58 is slightly domed when engaged with the lower housing 54 so that the inner portion of the lower seal 58 is slightly elevated above the outer portion of the lower seal 58.

The upper seal 56 may be fastened to an upper portion of the tube 12 or, in the embodiment shown in FIGS. 1 and 2, to the outside of an upper portion of the jacket 26 which encases the tube. The fastening may be done with glue or a hinge or other such fastening means known to those with skill in the art. Alternatively, the upper seal 56 may be fixed in position by machining a groove into the upper portion of the tube 12 or the outside of an upper portion of the jacket 26. Alternatively, the upper seal 56 may frictionally engage the housing of the tube 12. In any case, the upper seal 56 is ideally disposed between the upper outlet 16 and the upper ventilation holes 48. The upper seal 56 may be fixed by providing it with a central opening and fitting the seal onto the upper portion of the tube 12 or, in the case of the embodiments shown in FIG. 1 and FIG. 2, onto an upper portion of the jacket 26 and sliding it downwards to an appropriate position. With reference to FIGS. 1 and 2, the upper seal 56 is shown at a position below the upper outlet 16 of the tube 12 and above the uppermost of the upper ventilation holes 48. The outer edges of the upper seal 56 make contact with the inside wall of the upper housing 42.

The lower seal 58 is fastened to the outside of the side wall 50 of the exhaust chamber 32 at a location below the lower ventilation holes 52. In some embodiments, the lower seal 58 is fastened using glue or a hinge or other such means known to those skilled in the art. In other embodiments, a groove is provided in the outside of the exhaust chamber side wall 50 and the lower seal 58 fits within this groove (not shown). Alternatively, the lower seal 58 may frictionally engage the side wall 50 of the exhaust chamber 32. The outside edges of the lower seal 58 make contact with the inner wall of the lower housing 54.

In operation, a compressed air line is connected to the side inlet 30 of the enclosure cooler 10. Compressed air A is then allowed to flow through the air line and the side arm 30 toward the inlets 14. The air then vortexes upward in the tube 12 until it reaches the top of the tube 12. At this point, some of the warm air B exits the upper outlet 16, passes through the cap ventilation holes 38 and enters the interior space defined by the outside wall of the jacket 26 and the inside wall of the upper housing 42. This warm air B moves downward through this space and exerts a downward force against the upper seal 56. In response, the upper seal 56 flexes downward and breaks its contact with the inner wall of the upper housing 42 allowing the warm air B to move past the upper seal 56 and exit through the upper ventilation holes 48 to the atmosphere.

Returning now to the point where the warm air B reaches the top of the tube 12, as mentioned above, some of the warm air B escapes from the upper outlet 16. At this point, some of this warm air B is also deflected downwards by the upper top wall of the cap 36 and vortexes more slowly downwards in the center of the tube 12 along the axis of the tube 12. Transfer of heat occurs from the downward vortexing air to the upward vortexing air, thereby cooling the downward vortexing air. There are different explanations for this previously known vortex and heat transfer behaviour referred to as the Ranque-Hilsh effect. One explanation is the solid body rotation of the air in the tube whereby the inner air rotates at the same rate as the outer air, contrary to standard vortex behaviour. The rotation rate of the inner air may be caused by the effect of friction and the length of time that each parcel of air remains in the vortex. Further, because of the effect of centrifugal force, the outer air is under higher pressure, thus increasing the temperature.

The downward vortexing air continues downward in the tube 12. The downwardly vortexing air is cooled significantly when it enters hole 27 from the tube 12 because of the smaller diameter of the tube 12. The downwardly vortexing air continues into the passageway 31, exits the lower outlet 18 of the tube and enters the interior of the enclosure as significantly cooled air C.

As a result of the cooled air entering the enclosure 100, air D contained within the enclosure (which has been heated by the electronic components within the enclosure) is displaced out of the enclosure and into the enclosure exhaust chamber 32. This enclosure-warmed air D moves upwards in the exhaust chamber 32, is vented through the lower ventilation holes 52 in the side wall of the exhaust chamber 32, and enters the space defined by the outer wall of the exhaust chamber 32 and the inner wall of the lower housing 54. This enclosure-warmed air D reverses direction and moves downward through this space and exerts a downward force against the lower seal 58. In response, the lower seal 58 flexes downwards and breaks its contact with the inner wall of the lower housing 54, thus allowing the enclosure-warmed air D to move past the lower seal 58 to the outer atmosphere.

If the device is subjected to a spray of water (for example in a test to establish a NEMA rating) some of the sprayed water will enter the upper ventilation holes 48 and move upward to make contact with the upper seal 56. At this point, if the device is at rest (i.e. no air is circulating through it) the upper seal 56 will, upon impact by the spray of water, maintain contact with the inner wall of the upper housing 42 to thereby prevent water from moving further up the interior of the upper housing 42 where it could potentially enter the tube and enclosure via the upper outlet 16. In some embodiments, the upper seal 56 flexes upwards upon contact with the spray of water and the upward flexing causes the seal to maintain contact with the inner wall of the upper housing 42 to maintain the barrier to entry of water. If the device is operating, the downward flow of warmed air B past upper seal 56 prevents inflow of water. Thus the upper seal 56 must be configured so as to quickly return to its resting position in contact with upper housing 42. Similarly, when in operation, the downward movement of enclosure warmed air D prevents the entry of moisture and other contaminants through the lower ventilation holes 52 and eventually into the enclosure. At rest, the lower seal 58 prevents such entry by flexing upwards upon contact with the spray of water and the upward flexing causes the lower seal 58 to maintain contact with the inner wall of the lower housing 54 to maintain the barrier to entry of water. Thus the lower seal 58 must be configured to quickly return to its resting position when the device is not operating.

The upper seal 56 and lower seal 58 therefore work to provide the enclosure cooler 10 with a water barrier for protection of the enclosure from entry of water, chemicals used for cleaning and/or other detrimental elements.

It will be seen that the present invention has been described by way of preferred embodiments of various aspects of the invention. However, it will be understood that one skilled in the art may readily depart from the embodiments described in detail herein, while still remaining within the scope of the invention as defined in this patent specification as a whole including the claims thereto. If will be further understood that structural or functional equivalents of elements described herein are considered to be within the scope of the invention, as well as departures from any directional references, dimensions or configurations described herein.

What is claimed is:

1. An apparatus for cooling an enclosure, said enclosure including at least one opening to receive a stream of cool air and to discharge heated air from said enclosure, said apparatus comprising:
    a vortex tube having a first end with a first opening for discharge of warm air;
    a connecting piece for connecting the vortex tube to the enclosure, wherein the connecting piece has a second end opposed to the first end and the second end has a second end with a second opening for discharge of cool air, and an inlet between said ends for directing a stream of compressed air tangentially into the interior of said vortex tube, said tube, openings and inlet configured to achieve a Ranque-Hilsch vortex effect;
    a first housing covering said first end; a space within said first housing communicating with said first opening and the exterior of said first housing, to channel said warm air to the exterior;
    an attachment to connect said vortex tube to said at least one opening in said enclosure, wherein said second end of said tube discharges said cool air stream through said attachment into the interior of said enclosure;
    an air outlet conduit at an end of said attachment proximate to the enclosure, configured to communicate with said at least one opening in said enclosure for discharge of heated air from said enclosure; and
    at least one impervious barrier to permit the outflow of said warm air from said first housing and said heated air from said air outlet conduit, while blocking the inflow of moisture and other substances.

2. The apparatus of claim 1 wherein said at least one barrier comprises a first barrier associated with the first housing and a second barrier associated with the air outlet conduit.

3. The apparatus of claim 1 wherein said at least one barrier is a flexible annular disc.

4. The apparatus of claim 3 wherein said flexible annular disc is orientated between said vortex tube and said housing.

5. The apparatus of claim 1 wherein the first housing has a housing wall with at least one ventilation hole and the housing wall and vortex tube define a void.

6. The apparatus of claim 1 wherein the first housing extends substantially the full length of the vortex tube.

7. The apparatus of claim 1 further comprising a second housing surrounding said end of said attachment such that said air outlet conduit is defined by a space between said attachment and the wall of said second housing and said second housing protrudes into the enclosure.

8. The apparatus of claim 7 wherein said second housing is substantially continuous with said first housing.

9. The apparatus of claim 1 further comprising an intermediate chamber defined by said vortex tube and said first housing and wherein said intermediate chamber is configured to communicate with said first opening of said vortex tube.

10. The apparatus of claim 1 wherein a stream of compressed air may be fed into said inlet with sufficient velocity to generate a stream of cool air from said second opening.

11. A system comprising the apparatus from of claim 1 and the enclosure.

* * * * *

UNITED STATES PATENT AND TRADEMARK OFFICE
CERTIFICATE OF CORRECTION

PATENT NO. : 8,616,010 B2  
APPLICATION NO. : 13/124832  
DATED : December 31, 2013  
INVENTOR(S) : Bakos Page 1 of 1

It is certified that error appears in the above-identified patent and that said Letters Patent is hereby corrected as shown below:

In the Claims

Column 8, Line 45, Claim 11:

Delete the word "of"

Signed and Sealed this  
Twenty-second Day of July, 2014

Michelle K. Lee  
*Deputy Director of the United States Patent and Trademark Office*